(12) United States Patent
Hong (10) Patent No.: US 12,306,537 B2
(45) Date of Patent: May 20, 2025

(54) COATING AND DEVELOPMENT EQUIPMENT

(71) Applicant: KINGSEMI CO., LTD., Liaoning (CN)

(72) Inventor: Xudong Hong, Liaoning (CN)

(73) Assignee: KINGSEMI CO., LTD., Shenyang (CN)

( * ) Notice: Subject to any disclaimer, the term of this patent is extended or adjusted under 35 U.S.C. 154(b) by 551 days.

(21) Appl. No.: 17/764,167

(22) PCT Filed: Oct. 5, 2019

(86) PCT No.: PCT/CN2019/109832
§ 371 (c)(1),
(2) Date: Mar. 25, 2022

(87) PCT Pub. No.: WO2021/062881
PCT Pub. Date: Apr. 8, 2021

(65) Prior Publication Data
US 2022/0334484 A1   Oct. 20, 2022

(30) Foreign Application Priority Data
Sep. 30, 2019 (CN) .......................... 201910944293.1

(51) Int. Cl.
*G03F 7/16* (2006.01)
*B05C 13/00* (2006.01)
(Continued)

(52) U.S. Cl.
CPC ............... *G03F 7/16* (2013.01); *B05C 13/00* (2013.01); *B05C 13/02* (2013.01); *H01L 21/0274* (2013.01); *H01L 21/6715* (2013.01)

(58) Field of Classification Search
USPC ....................................... 118/500, 66, 69, 58
See application file for complete search history.

(56) References Cited

U.S. PATENT DOCUMENTS

| 2004/0168633 A1 | 9/2004 | Nozawa et al. |
| 2005/0211169 A1* | 9/2005 | Choi ................. H01L 21/67748 |
| | | 118/719 |

(Continued)

FOREIGN PATENT DOCUMENTS

| CN | 1674220 A | 9/2005 |
| CN | 101447408 A | 6/2009 |
| JP | 2015195303 A | 11/2015 |

OTHER PUBLICATIONS

International Search Report of PCT Patent Application No. PCT/CN2019/109832 issued on Jun. 24, 2020.

*Primary Examiner* — Y. T. Tadesse
(74) *Attorney, Agent, or Firm* — Andrew C. Cheng (57) ABSTRACT

Provided in the present invention is a coating and development equipment, comprising a cassette module, a first process module, a second process module, and an interface module. A first inter-layer process manipulator, an intra-layer process manipulator group and a second inter-layer process manipulator are arranged between the first process module and the second process module, and the first inter-layer process manipulator, the second inter-layer process manipulator, and manipulators in the intra-layer process manipulator group each have two groups of end effectors facing oppositely, the number of each group of end effectors is m, and m is a natural number greater than or equal to 2, whereby the handling of a plurality of wafers can be realized and the production efficiency can be improved.

27 Claims, 5 Drawing Sheets

(51) Int. Cl.
*B05C 13/02* (2006.01)
*H01L 21/02* (2006.01)
*H01L 21/027* (2006.01)
*H01L 21/67* (2006.01)

(56) References Cited

U.S. PATENT DOCUMENTS

2009/0142713 A1* 6/2009 Yamamoto ........ H01L 21/67225
 355/27
2017/0040203 A1* 2/2017 Caveney ........... H01L 21/68707

* cited by examiner

COATING AND DEVELOPMENT EQUIPMENT

FIELD OF TECHNOLOGY

The present invention relates to the technical field of semiconductor processing, in particular to a coating and development equipment.

BACKGROUND

In the existing photolithography process of semiconductor processing, a coating equipment, a photolithography equipment and a development equipment respectively complete a photoresist coating process flow, a photolithography process flow and a development process flow. With the improvement of the level of semiconductor processing technology, a mainstream of the market connects a coating and development equipment with the photolithography equipment to complete the whole group of photolithography process. A coating process flow and the development process flow are usually integrated on the same equipment. The production capacity of the coating and development equipment is greater than that of the photolithography equipment, while the production capacity of the coating and development equipment is determined by the bottleneck production capacity of a process unit and the bottleneck production capacity of a robot. A traditional equipment robot has a fixed form, and the speed of the robot is close to the limit. Improving the bottleneck production capacity of the robot of the equipment can only be achieved by increasing the number of robots, and increasing the number of robots would lead to a larger floor area of the development equipment. The larger floor area becomes another constraint that limits the production capacity.

Therefore, it is necessary to provide a new type of coating and development equipment to solve the above problems existing in the prior art.

SUMMARY

The purpose of the present invention is to provide a coating and development equipment, which can improve the working efficiency of a development equipment on the premise of the same number of robots and robot speed.

In order to achieve the above-mentioned purpose, the coating and development equipment of the present invention comprises a cassette module, a first process module, a second process module, and an interface module, wherein one ends of the first process module and the second process module are connected to the cassette module, the other ends of the first process module and the second process module are connected to the interface module, a first inter-layer process manipulator, an intra-layer process manipulator group and a second inter-layer process manipulator are arranged between the first process module and the second process module, and the first inter-layer process manipulator, the second inter-layer process manipulator, and manipulators in the intra-layer process manipulator group each have two groups of end effectors facing oppositely, and the number of each group of end effectors is m, and m is a natural number greater than or equal to 2.

The beneficial effects of the present invention are: the first process module and the second process module are arranged in parallel between the cassette module and the interface module, and the first process module and the second process module can work independently of each other, which saves maintenance time and improves production efficiency; the first inter-layer process manipulator, the second inter-layer process manipulator and the manipulators in the intra-layer process manipulator group each have two groups of end effectors facing oppositely, the number of each group of end effectors is m, and m is a natural number greater than or equal to 2, and multiple wafers can be transported simultaneously in one direction, thereby improving the production efficiency.

Preferably, the intra-layer process manipulator group comprises, from bottom to top, a first intra-layer process manipulator, a second intra-layer process manipulator and a third intra-layer manipulator with the same structure. The beneficial effects thereof are: the first intra-layer process manipulator, the second intra-layer process manipulator and the third intra-layer process manipulator can be used for transporting wafers in different positions in the first process module and the second process module and operate independently which improves the production efficiency, and they are arranged from bottom to top, making full use of a vertical space and saving the floor space.

Further, preferably, the first intra-layer process manipulator comprises a first vertical sliding portion, a first horizontal sliding portion and a first effector base, the first vertical sliding portion is arranged on an upper side of the first horizontal sliding portion, the first vertical sliding portion is slidably connected with the first horizontal sliding portion, and the first effector base is arranged on one side of the first vertical sliding portion. The beneficial effect thereof is that it is convenient for the first effector base to move in horizontal and vertical directions.

Further, preferably, the first effector base comprises a connecting portion, a first execution portion and a second execution portion.

Further, preferably, the connecting portion comprises a bearing portion and a vertical connecting portion, the vertical connecting portion is arranged on one side of the bearing portion, and the vertical connecting portion is slidably connected with the first vertical sliding portion.

Further, preferably, the upper side of the bearing portion is provided with sliding rails of the execution portion, the sliding rails of the execution portion are perpendicular to the vertical connecting portion, and the first execution portion and the second execution portion are arranged on an upper side of the sliding rails of the execution portion, and the first execution portion and the second execution portion are both parallel to the vertical connecting portion, and the second execution portion is fixedly connected with the sliding rails of the execution portion, and a lower side of the first execution portion is provided with sliding blocks of the execution portion, and the sliding blocks of the execution portion are slidably connected with the sliding rails of the execution portion. The beneficial effect thereof is that it is convenient to adjust an assembly error between the first execution portion and the second execution portion.

Further, preferably, a first upper slideway and a first lower slideway are provided on one side of the first execution portion facing away from the second execution portion, and the first upper slideway is provided with a first upper bending plate, the first upper bending plate is slidably connected with the first upper slideway, the first lower slideway is provided with a first lower bending plate, the first lower bending plate is slidably connected with the first lower slideway, a first upper fixing plate is arranged on the upper side of the first upper bending plate and the first lower bending plate, and one side of the first upper fixing plate is provided with a first group of end effectors. The beneficial effect thereof is that the first upper bending plate and the first lower bending plate jointly fix the first upper fixing plate, which can ensure the stability of the first upper fixing plate and prevent shaking.

Further, preferably, a second upper slideway and a second lower slideway are provided on one side of the second execution portion facing away from the first execution portion, and the second upper slideway is provided with a second upper bending plate, the second upper bending plate is slidably connected with the second upper slideway, the second lower slideway is provided with a second lower bending plate, the second lower bending plate is slidably connected with the second lower slideway, a second upper fixing plate is arranged on the upper side of the second upper bending plate and the second lower bending plate, and one side of the second upper fixing plate is provided with a second group of end effectors. The beneficial effect thereof is that the second upper bending plate and the second lower bending plate jointly fix the second upper fixing plate, which can ensure the stability of the second upper fixing plate and prevent shaking.

Further, preferably, the extension direction of the first group of end effectors is opposite to the extension direction of the second group of end effectors, and a first height difference exists between the first group of end effectors and the second group of end effectors. The beneficial effect thereof is: there is a height difference between the first group of end effectors and the second group of end effectors, and the first group of end effectors and the second group of end effectors can be overlapped in the vertical direction, saving the floor area on a horizontal plane.

Further, preferably, a second height difference exists between the first process module and the second process module, and the first height difference is equal to the second height difference. The beneficial effect thereof is: the height difference between the first process module and the second process module is the same as the height difference between the first group of end effectors and the second group of end effectors, such that the first group of end effectors and the second group of end effectors can complete grasping and placement of the wafers.

Further, preferably, the first group of end effectors comprise a first end effector and a second end effector, and the second group of end effectors comprise a third end effector and a fourth end effector.

Further, preferably, the first inter-layer process manipulator and the second inter-layer process manipulator have the same structure, and the first inter-layer process manipulator comprises a second vertical sliding portion. and a second effector base, and the second effector base has the same structure as the first effector base.

Preferably, the cassette module comprises a cassette manipulator and a cassette group, and the cassette manipulator is arranged between the cassette group and the first process module. The beneficial effect thereof is that it is convenient for the cassette manipulator to transport the wafers from the cassette to the first process module.

Further, preferably, the cassette manipulator comprises n end effectors facing the same direction, and n is a natural number greater than or equal to 2. The beneficial effect thereof is that it is convenient to transport a plurality of wafers from the cassette group at the same time.

Further, preferably, the interface module has a built-in interface manipulator, and the interface manipulator has the same structure as the cassette manipulator. The beneficial effect thereof is that it is convenient to transport a plurality of wafers from the second inter-layer process unit at the same time.

Preferably, the first process module and the second process module have the same structure, and the first process module comprises a first inter-layer process module, an intra-layer process module and a second inter-layer process module arranged in sequence. The beneficial effect thereof is that the structures of the first process module and the second process module are the same, which simplifies the process control of the first inter-layer process manipulator, the intra-layer process manipulator group and the second inter-layer process manipulator.

Further, preferably, the first inter-layer process module comprises a first inter-layer process unit and a first intra-layer transfer unit, and the first inter-layer process unit is located between the cassette module and the first intra-layer transfer unit. The beneficial effect thereof is that it is convenient for the first inter-layer process unit to receive the wafers from the cassette module and the first intra-layer transfer unit to receive processed wafers from the first inter-layer process unit.

Further, preferably, the first inter-layer process unit comprises a first wafer transfer high-precision cooling control unit group, a first wafer transfer unit group, a second wafer transfer unit group, a second wafer transfer high-precision cooling control unit group, a sticking unit group, a wafer defect detection unit group, and a third wafer transfer high-precision cooling control unit group, and the first wafer transfer unit group is arranged on the upper side of the first wafer transfer high-precision cooling control unit group, the second wafer transfer unit group is arranged on the upper side of the first wafer transfer unit group, and the second wafer transfer high-precision cooling control unit group is arranged on the upper side of the second wafer transfer unit group, the sticking unit group is arranged on the upper side of the second wafer transfer high-precision cooling control unit group, the wafer defect detection unit group is arranged on the upper side of the sticking unit group, and the third wafer transfer high-precision cooling control unit group is arranged on the upper side of the wafer defect detection unit group.

Further, preferably, the first intra-layer transfer unit has a built-in first high-precision cooling control unit group, and the first high-precision cooling control unit group is connected with the sticking unit group.

Further, preferably, the intra-layer process module comprises a first intra-layer process unit and a second intra-layer process unit, and the first intra-layer process unit is connected to the first inter-layer process module, and the second intra-layer process unit is connected to the second inter-layer process module.

Further, preferably, the first intra-layer process unit comprises a first height intra-layer process unit, a second height intra-layer process unit, and a third height intra-layer process unit, the second height intra-layer process unit is arranged on the upper side of the first height intra-layer process unit, and the third height intra-layer process unit is arranged on the upper side of the second height intra-layer process unit.

Further, preferably, the first height intra-layer process unit comprises a coated anti-reflection bottom layer unit group and a coated photoresist unit group, and the coated photoresist unit group is arranged on the upper side of the coated anti-reflection bottom layer unit group, the second height intra-layer process unit comprises a coated anti-reflection top layer unit group and a wafer back cleaning unit group, and the wafer back cleaning unit group is arranged on the upper side of the coated anti-reflection top layer unit group, and the third height intra-layer process unit comprises a first development unit group.

Further, preferably, the second intra-layer process unit comprises a fourth height intra-layer process unit, a fifth height intra-layer process unit and a sixth height intra-layer process unit, and the fifth height intra-layer process unit is arranged on the upper side of the fourth height intra-layer process unit, and the sixth height intra-layer process unit is arranged on the upper side of the fifth height intra-layer process unit.

Further, preferably, the fourth height intra-layer process unit comprises a high-temperature heat treatment unit group and a first heat treatment unit group, the first heat treatment unit group is arranged on the upper side of the high-temperature heat treatment unit group, and the fifth height intra-layer process unit comprises a second heat treatment unit group and an edge exposure unit group, the edge exposure unit group is arranged on the upper side of the second heat treatment unit group, and the sixth height intra-layer process unit comprises a second development unit group and a third heat treatment unit group, and the third heat treatment unit group is arranged on the upper side of the second development unit group.

Further, preferably, the second inter-layer process module comprises a second inter-layer process unit and a second intra-layer transfer unit, and the second inter-layer process unit is connected with the interface module, and the second intra-layer transfer unit is connected with the intra-layer process module.

Further, preferably, the second inter-layer process unit comprises a third wafer transfer unit group, a wafer surface cleaning unit group, a fourth wafer transfer unit group, a fourth heat treatment unit group and a fourth wafer transfer high-precision cooling control unit group, and the wafer surface cleaning unit group is arranged on the upper side of the third wafer transfer unit group, the fourth wafer transfer unit group is arranged on the upper side of the wafer surface cleaning unit group, the fourth heat treatment unit group is arranged on the upper side of the fourth wafer transfer unit group, and the fourth wafer transfer high-precision cooling control unit group is arranged on the upper side of the fourth heat treatment unit group.

Further, preferably, the second intra-layer transfer unit comprises a second high-precision cooling control unit group, and the second high-precision cooling control unit group is connected with the high-temperature heat treatment unit group.

Further, preferably, the first intra-layer process manipulator, the first height intra-layer process unit, and the fourth height intra-layer process unit are located in the same horizontal plane, the second intra-layer process manipulator, the second height intra-layer process unit and the fifth height intra-layer process unit are located in the same horizontal plane, and the third intra-layer process manipulator, the third height intra-layer process unit and the sixth height intra-layer process unit are located in the same horizontal plane. The beneficial effects thereof are: it is convenient for the first intra-layer process manipulator to transport the wafers in the first height intra-layer process unit and the fourth height intra-layer process unit, and it is convenient for the second intra-layer process manipulator to transport the wafers in the second height intra-layer process unit and the fifth height intra-layer process unit, and it is further convenient for the third intra-layer process manipulator to transport the wafers in the third height intra-layer process unit and the sixth height intra-layer process unit.

DESCRIPTION OF THE EMBODIMENTS

In order to make objectives, technical solutions, and advantages of the invention clearer, the technical solutions in the invention are described clearly and completely in the following with reference to accompanying drawings in the embodiments of the invention. Apparently, the described embodiments are only part rather than all of the embodiments of the invention. Based on the embodiments of the invention, all the other embodiments obtained by those of ordinary skill in the art without inventive effort are within the scope of the invention. Unless otherwise mentioned, all technical and scientific terms used herein have the same meaning as commonly understood by one of ordinary skill in the art to which the invention belong. As used herein, "comprising" and similar words mean that the elements or things appearing before the words encompass the elements or things recited after the words and their equivalents, but do not exclude other elements or things.

Figure 1:
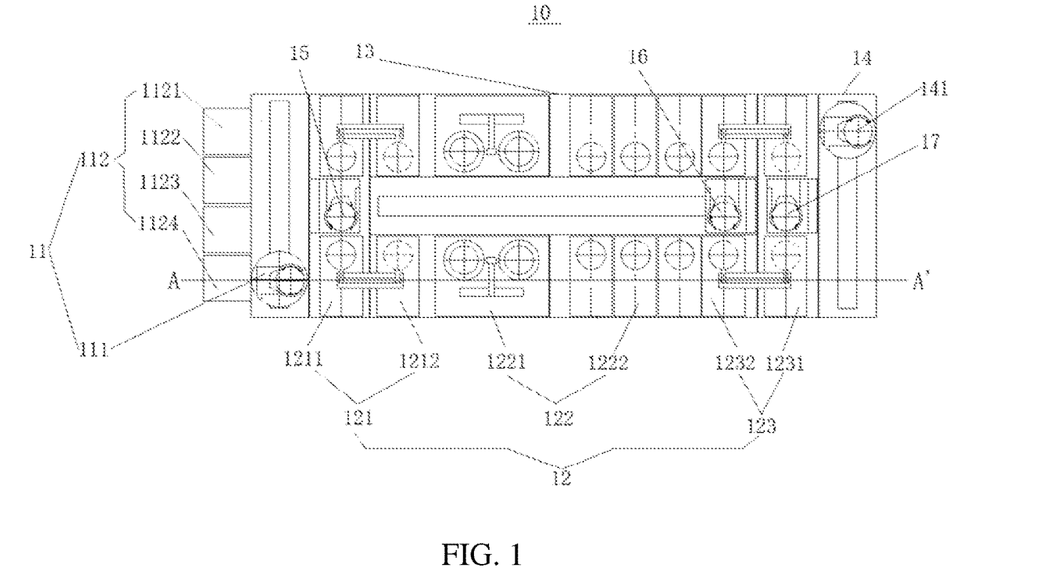
FIG. 1 is the top view of the coating and development equipment of the present invention.

In view of the problems existing in the prior art, an embodiment of the present invention provides a coating and development equipment. Referring to FIG. 1, the coating and development equipment 10 comprises a cassette module 11, a first process module 12, and a second process module 13 and an interface module 14, wherein one ends of the first process module 12 and the second process module 13 are connected to the cassette module 11, and the other ends of the first process module 12 and the second process module 13 are connected to the interface module 14, and the first process module 12 and the second process module 13 have the same structure, and there is a second height difference between the first process module 12 and the second process module 13, a first inter-layer process manipulator 15, an intra-layer process manipulator group 16 and a second inter-layer process manipulator 17 are arranged between the first process module 12 and the second process module 13. The first inter-layer process manipulator 15 is connected to the cassette module 11, and the second inter-layer process manipulator 17 is connected to the interface module 14, and the intra-layer process manipulator group 16 is connected to the second inter-layer process manipulator 17. The first inter-layer process manipulator 15, the second inter-layer process manipulator 17 and manipulators in the intra-layer process manipulator group 16 each have two groups of end effectors (not shown in the figure) facing oppositely. The first process module 12 comprises a first inter-layer process module 121, an intra-layer process module 122 and a second inter-layer process module 123 arranged in sequence. The first inter-layer process module 121 comprises a first inter-layer process unit 1211 and a first intra-layer transfer unit 1212, and the first inter-layer process unit 1211 is located between the cassette module 11 and the first intra-layer transfer unit 1212. The intra-layer process module 122 comprises a first intra-layer process unit 1221 and a second intra-layer process unit 1222, and the first intra-layer process unit 1221 is connected to the first inter-layer process module 121, and the second intra-layer process unit 1222 is connected to the second inter-layer process module 123. The second inter-layer process module 123 comprises a second inter-layer process unit 1231 and a second intra-layer transfer unit 1232, and the second inter-layer process unit 1231 is connected to the interface module 14, and the second intra-layer transfer unit 1232 is connected to the intra-layer process module 122.

In some embodiments of the present invention, the interface module is connected to a lithography machine.

In some embodiments of the present invention, the number of each group of end effectors is m, and m is a natural number greater than or equal to 2.

Figure 2:
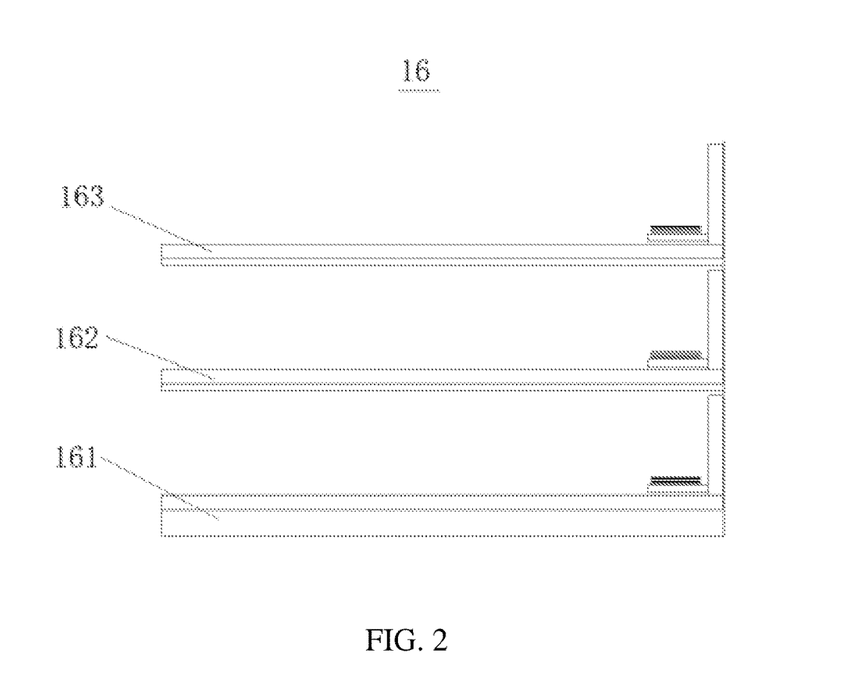
FIG. 2 is a schematic structural diagram of an intra-layer process manipulator group of the present invention.

FIG. 2 is a schematic structural diagram of an intra-layer process manipulator group in some detailed embodiments of the present invention. Referring to FIG. 2, the intra-layer process manipulator group 16 comprises, from bottom to top, a first intra-layer process manipulator 161, a second intra-layer process manipulator 162 and a third intra-layer manipulator 163 with the same structure.

In some embodiments of the present invention, referring to FIG. 1, the cassette module 11 comprises a cassette manipulator 111 and a cassette group 112, and the cassette manipulator 111 is arranged between the cassette group 112 and the first process module 12, the cassette group 112 comprises a first cassette 1121, a second cassette 1122, a third cassette 1123 and a fourth cassette 1124.

In some embodiments of the present invention, referring to FIG. 1, the cassette manipulator 111 comprises n end effectors (not shown in the figure) facing the same direction, and n is a natural number greater than or equal to 2.

In some embodiments of the present invention, referring to FIG. 1, the interface module 14 has a built-in interface manipulator 141, and the interface manipulator 141 has the same structure as the cassette manipulator 111.

Figure 3:
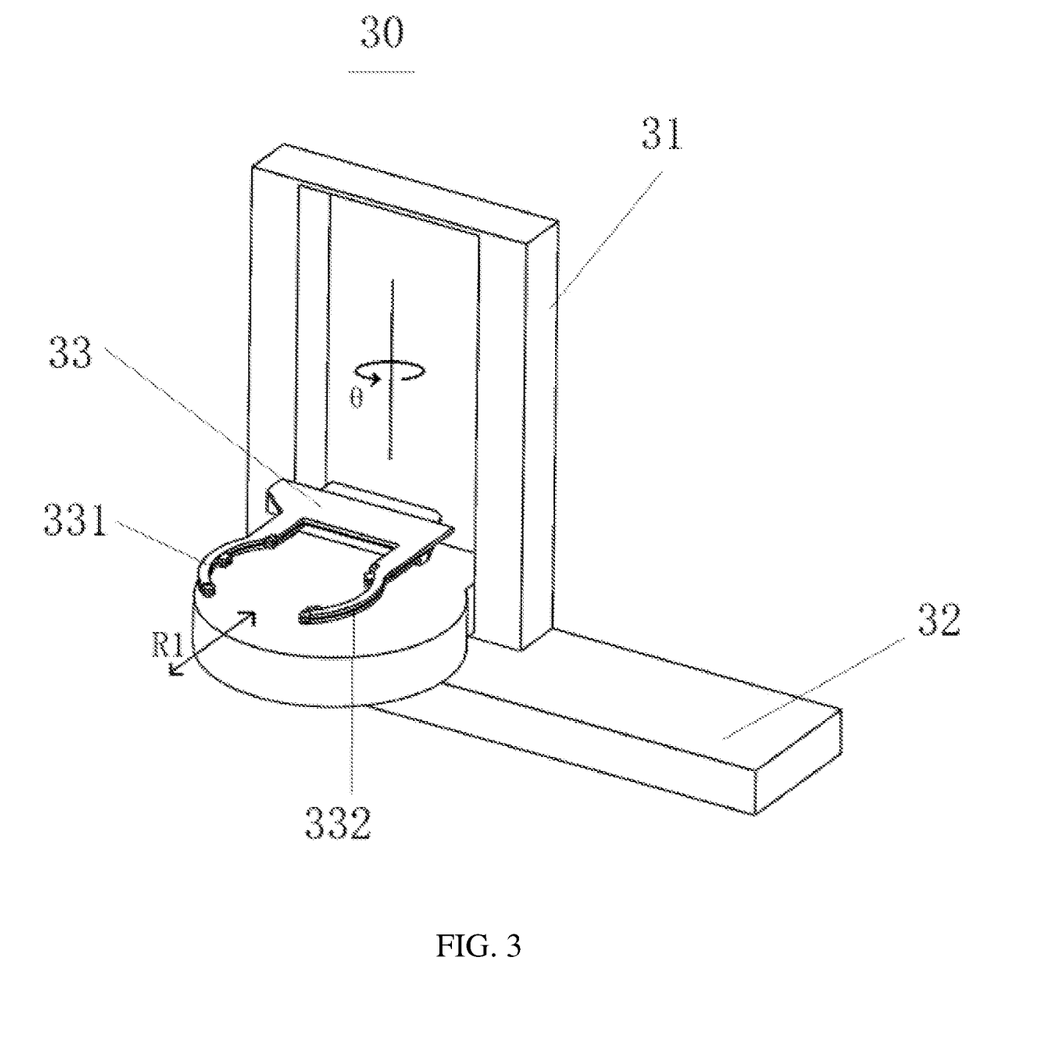
FIG. 3 is a schematic structural diagram of a first type of manipulator of the present invention.

FIG. 3 is a schematic structural diagram of a first type of manipulator in some detailed embodiments of the present invention. Referring to FIG. 1 and FIG. 3, the structures of the interface manipulator 141 and the cassette manipulator 111 are the same as that of the first type of manipulator 30, and the first type of manipulator 30 comprises a vertical sliding plate 31, a horizontal sliding plate 32 and a fixed base 33. The upper surface of the fixed base 33 is provided with a left end effector 331 and a right end effector 332 in the same direction, and a rotating shaft (not shown in the figures) is arranged in the fixed base 33, and the rotating shaft is driven by a motor (not shown in the figures) so as to rotate the upper surface of the fixed base 33, thereby driving the left end effector 331 and the right end effector 332 to rotate, and the rotation direction of the rotating shaft is the same as the rotation direction of 0. The left end effector 331 and the right end effector 332 run telescopically along the R1 direction, and the vertical sliding plate 31 is slidably connected to the horizontal sliding plate 32, and is driven by a motor (not shown in the figures) so that the sliding base drives the vertical sliding plate 31 to slide along the horizontal sliding plate 32, and the fixed base 33 is slidably connected to the vertical sliding plate 31 and is driven by a motor (not shown in the figures) to make the fixed base 33 slide along the vertical sliding plate 31. The interface manipulator 141 and the cassette manipulator 111 are common technologies in the art, and will not be repeated here.

Figure 4:
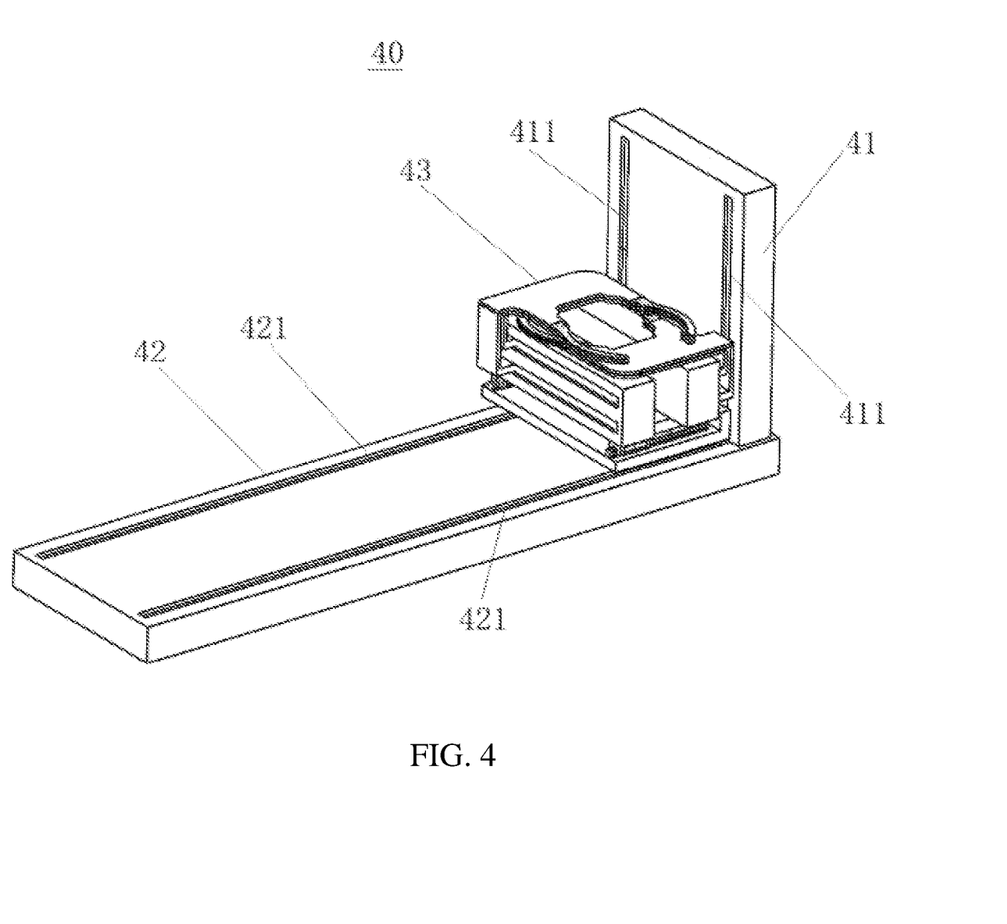
FIG. 4 is a schematic structural diagram of a first intra-layer process manipulator of the present invention.

FIG. 4 is a schematic structural diagram of a first intra-layer process manipulator in some detailed embodiments of the present invention. Referring to FIG. 4, the first intra-layer manipulator 40 comprises a first vertical sliding portion 41, a first horizontal sliding portion 42 and a first effector base 43, wherein the first vertical sliding portion 41 and the first horizontal sliding portion 42 are in the shape of a straight plate, and two horizontal sliding rails 421 are arranged in parallel on an upper side of the first horizontal sliding portion 42. The lower side of the first vertical sliding portion 41 is provided with two first sliding blocks (not shown in the figure), and the two first horizontal sliding blocks are slidably connected to the two horizontal sliding rails 421 in one-to-one correspondence. And the two horizontal slide rails 421 are perpendicular to the first vertical sliding portion 41, and two parallel first vertical slide rails 411 are provided on one side of the first vertical sliding portion 41.

Figure 5:
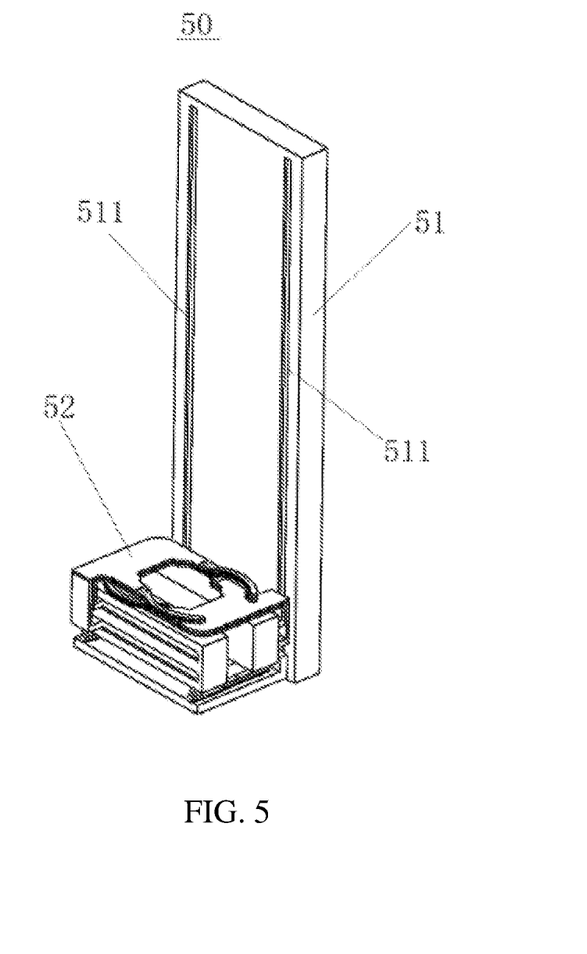
FIG. 5 is a schematic structural diagram of a first inter-layer process manipulator of the present invention.

FIG. 5 is a schematic structural diagram of a first inter-layer process manipulator in some detailed embodiments of the present invention. Referring to FIG. 5, the first inter-layer process manipulator 50 comprises a second vertical sliding portion 51 and a second effector base 52, and the second effector base 52 is slidably connected to the second vertical sliding portion 51. The second vertical sliding portion 51 is in the shape of a straight plate, and one side of the second vertical sliding portion 51 is provided with two second vertical sliding rails 511 arranged in parallel.

In some embodiments of the present invention, the structure of the second inter-layer process manipulator is the same as that of the first inter-layer process manipulator, and the second effector base has the same structure as the first effector base.

Figure 6:
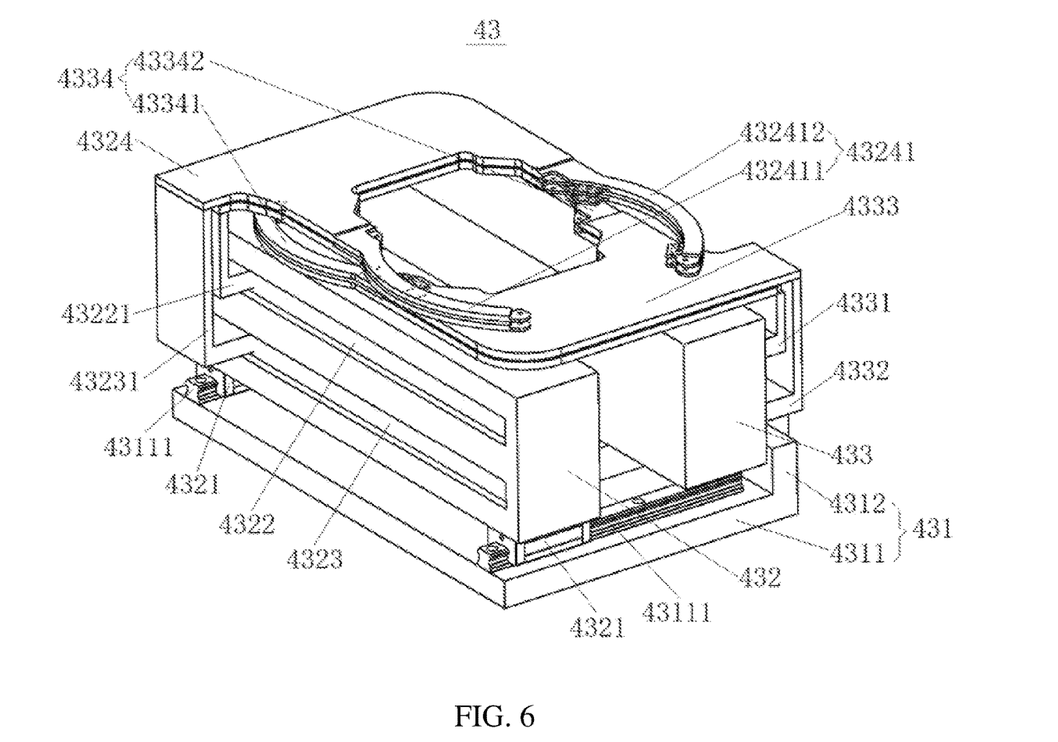
FIG. 6 is a schematic structural diagram of a first effector base of the present invention.

FIG. 6 is a schematic structural diagram of a first effector base in some detailed embodiments of the present invention. Referring to FIG. 4 and FIG. 6, the first effector base 43 comprises a connecting portion 431, a first execution portion 432 and a second execution portion 433, wherein the connecting portion 431 comprises a bearing portion 4311 and a vertical connecting portion 4312, wherein the vertical connecting portion 4312 is arranged on one side of the bearing portion 4311, and one side of the vertical connecting portion 4312 facing away from the second execution portion 433 is provided with two second sliding blocks (not shown in the figures). The two second sliding blocks are slidably connected to the two first vertical sliding rails 411 in one-to-one correspondence.

In some preferred embodiments of the present invention, referring to FIG. 6, the bearing portion 4311 and the vertical connecting portion 4312 are both in the shape of a rectangular plate, and the width of the vertical connecting portion 4312 is smaller than that of the bearing portion 4311. A long side of the vertical connecting portion 4312 is connected with a long side of the bearing portion 4311 and they have the same length.

In some preferred embodiments of the present invention, referring to FIG. 4 and FIG. 6, the vertical connecting portion 4312 is perpendicular to the bearing portion 4311, and the vertical connecting portion is parallel to the first vertical sliding portion 41, so that the bearing portion 4311 can move vertically while keeping horizontal.

Referring to FIG. 6, the upper side of the bearing portion 4311 is provided with sliding rails 43111 of the execution portion, the number of the sliding rails 43111 of the execution portion is two, and the first execution portion 432 and the second execution portion 433 are arranged on the upper side of the two sliding rails 43111 of the execution portion, and the first execution portion 432 and the second execution portion 433 are both parallel to the vertical connecting portion 4312, and the second execution portion 433 is fixedly connected with the sliding rails 43111 of the execution portion, and a lower side of the first execution portion 432 is provided with sliding blocks 4321 of the execution portion, and the number of the sliding blocks 4321 of the execution portion is two. In addition, the sliding blocks 4321 of the execution portion is slidably connected to the sliding rails 43111 of the execution portion in a one-to-one correspondence, so as to adjust an assembly error between the first execution portion 432 and the second execution portion 433.

In some preferred embodiments of the present invention, referring to FIG. 6, the two sliding rails 43111 of the execution portion are each arranged along a short side of the bearing portion 4311, and the two sliding rails 43111 of the execution portion are both perpendicular to the vertical connecting portion 4312, so as to make the travel of the two sliding rails 43111 of the execution portion shortest.

In some preferred embodiments of the present invention, referring to FIG. 6, the second execution portion 433 is fixed to one ends of the two sliding rails 43111 of the execution portion, and an active space is formed between the first execution portion 432 and the second execution portion 433, so that the first execution portion 432 can move relative to the second execution portion 433, which is convenient for adjusting the relative position between the first execution portion 432 and the second execution portion 433.

Referring to FIG. 6, one side of the first execution portion 432 facing away from the second execution portion 433 is provided with a first upper slideway 4322 and a first lower slideway 4323 that are parallel to each other, and a first upper bending plate 43221 is provided on the first upper slideway 4322, the first upper bending plate 43221 is slidably connected with the first upper slideway 4322, and the first lower slideway 4323 is provided with a first lower bending plate 43231, and the first lower bending plate 43231 is slidably connected with the first lower slideway 4323, and a first upper fixing plate 4324 is provided on the upper side of the first upper bending plate 43221 and the first lower bending plate 43231, the first upper bending plate 43221 and the first lower bending plate 43231 jointly fix the first upper fixing plate 4324 to increase the stability of the first upper fixing plate 4324 and prevent shaking. One side of the first upper fixing plate 4324 is provided with a first group of end effectors 43241, the first group of end effectors 43241 comprises a first end effector 432411 and a second end effector 432412, wherein the first end effector 432411 and the second end effector 432412 are both common technologies in the art, and will not be repeated here.

In some preferred embodiments of the present invention, referring to FIG. 6, the first execution portion 432 is a cuboid, and the first upper bending plate 43221 and the first lower bending plate 43231 are both L-shaped, so that all the first upper bending plate 43221 and the first lower bending plate 43231 are only attached to one surface of the first execution portion 432, thereby reducing the occupied space of the first upper bending plate 43221 and the first lower bending plate 43231.

In still some preferred embodiments of the present invention, referring to FIG. 6, the first upper slideway 4322 and the first lower slideway 4323 are cuboid slideways, and the first upper slideway 4322 and the first lower slideway 4323 are all parallel to the upper surface of the first execution portion 432, so that the first group of end effectors 43241 can move horizontally.

In still some preferred embodiments of the present invention, referring to FIG. 6, a first embedded sliding block (not shown in the figure) is provided at one end of the first upper bending plate 43221 connected to the first upper slideway 4322. The first embedded sliding block can slide in the first upper slideway 4322 to reduce a frictional force between the first upper bending plate 43221 and the first upper slideway 4322, which facilitates sliding of the first upper bending plate 43221.

In still some preferred embodiments of the present invention, referring to FIG. 6, a second embedded sliding block (not shown in the figure) is provided at one end of the first lower bending plate 43231 connected to the first lower slideway 4323. The second embedded sliding block can slide in the first lower slideway 4323 to reduce a friction force between the first lower bending plate 43231 and the first lower slideway 4323, which facilitates sliding of the first lower bending plate 432331.

In still some preferred embodiments of the present invention, referring to FIG. 6, the first end effector 432411 and the second end effector 432412 are arranged on both sides of the same end of the first upper fixing plate 4324, and the first end effector 432411 and the second end effector 432412 are located in the same plane, which is convenient for grasping or placing two wafers at the same time.

Referring to FIG. 6, one side of the second execution portion 433 facing away from the first execution portion 432 is provided with a second upper slideway (not shown in the figure) and a second lower slideway (not shown in the figure) that are parallel to each other. The second upper slideway is provided with a second upper bending plate 4331, and the second upper bending plate 4331 is slidably connected with the second upper slideway. The second lower slideway is provided with a second lower bending plate 4332, and the second lower bending plate 4332 is slidably connected with the second lower slideway. The upper side of the second upper bending plate 4331 and the second lower bending plate 4332 is provided with a second upper fixing plate 4333, and the second upper bending plate 4331 and the second lower bending plate 4332 jointly fix the second upper fixing plate 4333 to increase the stability of the second upper fixing plate 4333 and prevent shaking. A second group of end effectors 4334 are provided on one side of the second upper fixing plate 4333, and the second group of end effectors 4334 comprise a third end effector 43341 and a fourth end effector 43342, wherein the third end effector 43341 and the fourth end effector 43342 are both common technologies in the art, and will not be repeated here.

In some preferred embodiments of the present invention, referring to FIG. 6, the second execution portion 433 is a cuboid, and the second upper bending plate 4331 and the second lower bending plate 4332 are both L-shaped, so that all the second upper bending plate 4331 and the second lower bending plate 4332 are only attached to one surface of the second execution portion, thereby reducing the occupied space of the second upper bending plate 4331 and the second lower bending plate 4332.

In still some preferred embodiments of the present invention, referring to FIG. 6, the second upper slideway and the second lower slideway are cuboid slideways, and the second upper slideway and the second lower slideway are all parallel to the upper surface of the second execution portion 433, so that the second group of end effectors 4334 can move horizontally.

In still some preferred embodiments of the present invention, referring to FIG. 6, a third embedded sliding block (not shown in the figure) is provided at one end of the second upper bending plate 4331 connected to the second upper slideway. The third embedded sliding block can slide in the second upper slideway to reduce a frictional force between the second upper bending plate 4331 and the second upper slideway, which facilitates sliding of the second upper bending plate 4331.

In still some preferred embodiments of the present invention, referring to FIG. 6, a fourth embedded sliding block (not shown in the figure) is provided at one end of the second lower bending plate 4332 connected to the second lower slideway. The fourth embedded sliding block can slide in the first lower slideway to reduce a friction force between the second lower bending plate 4332 and the second lower slideway, which facilitates sliding of the second lower bending plate 4332.

In still some preferred embodiments of the present invention, referring to FIG. 6, the third end effector 43341 and the fourth end effector 43342 are arranged on both sides of the same end of the second upper fixing plate 4333, and the third end effector 43341 and the fourth end effector 43342 are located in the same plane, which is convenient for grasping or placing two wafers at the same time.

Referring to FIG. 6, the extension direction of the first group of end effectors 43241 is opposite to the extension direction of the second group of end effectors 4334, and the first group of end effectors 43241 are located on the upper side of the second group of end effectors 4334. A first height difference exists between the first group of end effectors 43241 and the second group of end effectors 4334, so that the first group of end effectors 43241 can overlap to the upper side of the second group of end effectors 4334, which fully utilizes the space in the vertical direction of the first effector base 43 and reduces the space occupied in the horizontal direction.

The above-mentioned manipulators are all driven by motors, which provide sliding driving forces.

In some preferred embodiments of the present invention, referring to FIG. 1 and FIG. 6, the first group of end effectors 43241 are located on the upper side of the second group of end effectors 4334, and the distance from the horizontal plane where the highest point of the upper surface of the first group of end effectors 43241 is located to the horizontal plane where the highest point of the upper surface of the second group of end effectors 4334 is located is d, that is, the first height difference is d. The horizontal plane where the lowest point of the bottom surface of the first process module 12 locates is higher than the horizontal plane where the lowest point of the bottom surface of the second process module 13 is located, and the distance between the two horizontal planes is d, that is, the second height difference is d. The first height difference is equal to the second height difference. The overall structure, size, etc. of the first process module 12 and the second process module 13 are exactly the same. Therefore, the horizontal plane where the lowest point of the bottom surface of each sub-module in the first process module 12 is located is higher than the horizontal plane where the lowest point of the bottom surface of the sub-module at the corresponding position in the second process module 13 is located, and the height difference is also d, so that the first group of end effectors 43241 can complete the grasping and placement of the wafers from the sub-modules in the first process module 12, and the second group of end effectors 4334 can complete the grasping and placement of the wafers from the sub-modules in corresponding positions in the second process module 13.

In some preferred embodiments of the present invention, referring to FIG. 6, the height difference between the first process module 12 and the second process module 13 is the same as the height difference between the first group of end effectors 43241 and the second group of end effectors 4334, that is, the first height difference is equal to the second height difference, so that when the first group of end effectors 43241 and the second group of end effectors 4334 grab or place the wafers, under the condition that the height of the sub-modules in the second process module 13 is adapted to the height of the second group of end effectors 4334, the first process module 12 does not need to be specially provided with a thimble mechanism to lift the position of the sub-modules to adapt to the first group of end effectors 43241, or under the condition that the height of the sub-modules in the first process module 12 is adapted to the height of the first group of end effectors 43241, the second process module 13 does not need to be specially provide with the thimble mechanism to lower the position of the sub-modules to adapt to the second group of end effectors 4334, so that process control becomes simple.

Figure 7:
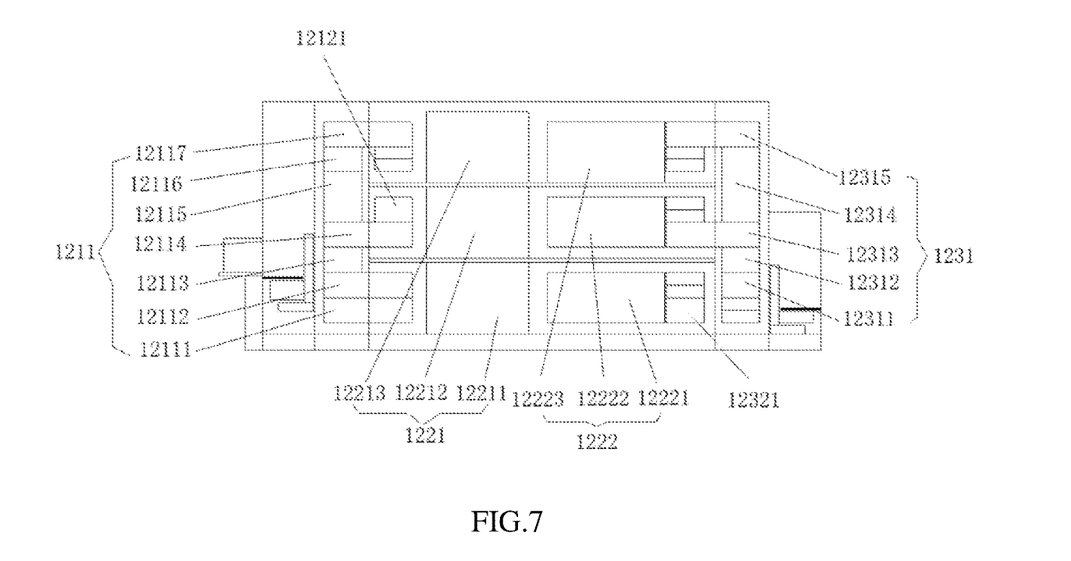
FIG. 7 is a cross-sectional view taken along the direction A-A' of FIG. 1.

FIG. 7 is a cross-sectional view taken along the direction A-A' of FIG. 1. Referring to FIG. 7, the first inter-layer process unit 1211 comprises a first wafer transfer high-precision cooling control unit group 12111, a first wafer transfer unit group 12112, a second wafer transfer unit group 12113, a second wafer transfer high-precision cooling control unit group 12114, a sticking unit group 12115, a wafer defect detection unit group 12116, and a third wafer transfer high-precision cooling control unit group 12117, and the first wafer transfer unit group 12112 is arranged on the upper side of the first wafer transfer high-precision cooling control unit group 12111, the second wafer transfer unit group 12113 is arranged on the upper side of the first wafer transfer unit group 12112, and the second wafer transfer high-precision cooling control unit group 12114 is arranged on the upper side of the second wafer transfer unit group 12113, the sticking unit group 12115 is arranged on the upper side of the second wafer transfer high-precision cooling control unit group 12114, the wafer defect detection unit group 12116 is arranged on the upper side of the sticking unit group 12115, and the third wafer transfer high-precision cooling control unit group 12117 is arranged on the upper side of the wafer defect detection unit group 12116.

In some embodiments of the present invention, referring to FIG. 7, the first intra-layer transfer unit (not shown in the figure) has a built-in first high-precision cooling control unit group 12121, and the first high-precision cooling control unit group 12121 is connected with the sticking unit group 12115.

In some embodiments of the present invention, referring to FIG. 7, the first intra-layer process unit 1221 comprises a first height intra-layer process unit 12211, a second height intra-layer process unit 12212, and a third height intra-layer process unit 12213, the second height intra-layer process unit 12212 is arranged on the upper side of the first height intra-layer process unit 12211, and the third height intra-layer process unit 12213 is arranged on the upper side of the second height intra-layer process unit 12212.

In some embodiments of the present invention, the first height intra-layer process unit comprises a coated anti-reflection bottom layer unit group and a coated photoresist unit group, and the coated photoresist unit group is arranged on the upper side of the coated anti-reflection bottom layer unit group.

In some embodiments of the present invention, the second height intra-layer process unit comprises a coated anti-reflection top layer unit group and a wafer back cleaning unit group, and the wafer back cleaning unit group is arranged on the upper side of the coated anti-reflection top layer unit group.

In some embodiments of the present invention, the third height intra-layer process unit comprises a first development unit group.

In some embodiments of the present invention, referring to FIG. 7, the second intra-layer process unit 1222 comprises a fourth height intra-layer process unit 12221, a fifth height intra-layer process unit 12222 and a sixth height intra-layer process unit 12223, and the fifth height intra-layer process unit 12222 is arranged on the upper side of the fourth height intra-layer process unit 12221, and the sixth height intra-layer process unit 12223 is arranged on the upper side of the fifth height intra-layer process unit 12222.

In some embodiments of the present invention, the fourth height intra-layer process unit comprises a high-temperature heat treatment unit group and a first heat treatment unit group, and the first heat treatment unit group is arranged on the upper side of the high temperature heat treatment unit group.

In some embodiments of the present invention, the fifth height intra-layer process unit comprises a second heat treatment unit group and an edge exposure unit group, and the edge exposure unit group is arranged on the upper side of the second heat treatment unit group.

In some embodiments of the present invention, the sixth height intra-layer process unit comprises a second development unit group and a third heat treatment unit group, and the third heat treatment unit group is arranged on the upper side of the second development unit group.

In some embodiments of the present invention, referring to FIG. 7, the second inter-layer process unit 1231 comprises a third wafer transfer unit group 12311, a wafer surface cleaning unit group 12312, a fourth wafer transfer unit group 12313, a fourth heat treatment unit group 12314 and a fourth wafer transfer high-precision cooling control unit group 12315, and the wafer surface cleaning unit group 12312 is arranged on the upper side of the third wafer transfer unit group 12311, the fourth wafer transfer unit group 12313 is arranged on the upper side of the wafer surface cleaning unit group 12312, the fourth heat treatment unit group 12314 is arranged on the upper side of the fourth wafer transfer unit group 12313, and the fourth wafer transfer high-precision cooling control unit group 12315 is arranged on the upper side of the fourth heat treatment unit group 12314.

In some embodiments of the present invention, referring to FIG. 7, the second intra-layer transfer unit (not shown in the figure) comprises a second high-precision cooling control unit group 12321, and the second high-precision cooling control unit group 12321 is connected with the high-temperature heat treatment unit group (not shown in the figure).

In some embodiments of the present invention, the first intra-layer process manipulator, the first height intra-layer process unit, and the fourth height intra-layer process unit are located in the same horizontal plane, and the end effector on the first intra-layer process manipulator can reach any position of the first height intra-layer process unit and the fourth height intra-layer process unit. The second intra-layer process manipulator, the second height intra-layer process unit, and the fifth height intra-layer process unit are located in the same horizontal plane, and the end effector on the second intra-layer process manipulator can reach any position of the second height intra-layer process unit and the fifth height intra-layer process unit. The third intra-layer process manipulator, the third height intra-layer process unit, and the sixth height intra-layer process unit are located in the same horizontal plane, and the end effector on the third intra-layer process manipulator can reach any position of the third height intra-layer process unit and the sixth height intra-layer process unit.

In some embodiments of the present invention, the first wafer transfer high-precision cooling control unit group, the second wafer transfer high-precision cooling control unit group, the third wafer transfer high-precision cooling control unit group, and the fourth wafer transfer high-precision cooling control unit group each comprise at least two wafer transfer high-precision cooling control units. Specifically, the first wafer transfer high-precision cooling control unit group, the second wafer transfer high-precision cooling control unit group, the third wafer transfer high-precision cooling control unit group, and the fourth wafer transfer high-precision cooling control unit group each comprise two of the wafer transfer high-precision cooling control units. The first wafer transfer high-precision cooling control unit group, the second wafer transfer high-precision cooling control unit group, and the third wafer transfer high-precision cooling control unit group extend from the first inter-layer process unit into the first intra-layer transfer unit, and the fourth wafer transfer high-precision cooling control unit group extends from the second inter-layer process unit into the second intra-layer transfer unit, wherein the wafer transfer high-precision cooling control unit is a common technology in the art, and details will not be repeated here.

In some embodiments of the present invention, the first wafer transfer unit group and the third wafer transfer unit group each comprise at least two wafer transfer units. Specifically, the first wafer transfer unit group and the third wafer transfer unit group each comprise two of the wafer transfer units, and the first wafer transfer unit group extends from the first inter-layer process unit into the first intra-layer transfer unit. The first high-precision cooling control unit group is arranged on the upper side of the first wafer transfer unit group, and the third wafer transfer unit extends from the second inter-layer process unit into the second intra-layer transfer unit.

In some embodiments of the present invention, the second wafer transfer unit group and the fourth wafer transfer unit group each comprise at least two wafer transfer units. Specifically, the first wafer transfer unit group and the third wafer transfer unit group each comprise two of the wafer transfer units, wherein the wafer transfer unit is a common technology in the art, and details will not be repeated here.

In some embodiments of the present invention, the first high-precision cooling control unit group and the second high-precision cooling control unit group comprise at least two high-precision cooling control units. Specifically, the first high-precision cooling control unit group and the second high-precision cooling control unit group comprise two of the high-precision cooling control units, wherein the high-precision cooling control unit is a common technology in the art, and details are not repeated here.

In some embodiments of the present invention, the sticking unit group comprises at least two sticking units. Specifically, the sticking unit group comprises four of the sticking units, wherein the sticking unit is a common technology in the art, and the details are not repeated here.

In some embodiments of the present invention, the wafer defect detection unit group comprises at least two wafer defect detection units. Specifically, the wafer defect detection unit group comprises two of the wafer defect detection units, wherein the wafer defect detection unit is a common technology in the art, and details are not repeated here.

In some embodiments of the present invention, the coated anti-reflection bottom layer unit group comprises at least two wafer defect detection units. Specifically, the coated anti-reflection bottom layer unit group comprises two of the wafer defect detection units, wherein the wafer defect detection unit is a common technology in the art, and details are not repeated here.

In some embodiments of the present invention, the coated photoresist unit group comprises at least two coated photoresist units. Specifically, the coated photoresist unit group comprises two of the coated photoresist units, wherein the coated photoresist unit is a common technology in the art, and details are not repeated here.

In some embodiments of the present invention, the coated anti-reflection top layer unit group comprises at least two coated anti-reflection top layer units. Specifically, the coated anti-reflection top layer unit group comprises two of the coated anti-reflection top layer units, wherein the coated anti-reflection top layer unit is a common technique in the art, and details are not repeated here.

In some embodiments of the present invention, the wafer back cleaning unit group comprises at least two wafer back cleaning units. Specifically, the wafer back cleaning unit group comprises two of the wafer back cleaning units, wherein the wafer back cleaning unit is a common technology in the art, and details are not repeated here.

In some embodiments of the present invention, the first development unit group and the second development unit group each comprise at least two development units. Specifically, the first development unit group comprises four of the development units, and the second development unit group comprises two of the development units, wherein the development unit is a common technology in the art, and details are not repeated here.

In some embodiments of the present invention, the high-temperature heat treatment unit group comprises at least two high-temperature heat treatment units. Specifically, the high-temperature heat treatment unit group comprises six of the high-temperature heat treatment units, wherein the high-temperature heat treatment unit is a common technology in the art, and the details are not repeated here.

In some embodiments of the present invention, the first heat treatment unit group, the second heat treatment unit group, the third heat treatment unit group and the fourth heat treatment unit group each comprise at least two heat treatment units. Specifically, the first heat treatment unit group, the second heat treatment unit group, the third heat treatment unit group, and the fourth heat treatment unit group each comprise six of the heat treatment units, wherein the heat treatment unit is a common technology in the art, and the details are not repeated here.

In some embodiments of the present invention, the edge exposure unit group comprises at least two edge exposure units. Specifically, the edge exposure unit group comprises six of the edge exposure units, wherein the edge exposure unit is a common technology in the art, and the details are not repeated here.

In some embodiments of the present invention, the wafer surface cleaning unit group comprises at least two wafer surface cleaning units. Specifically, the wafer surface cleaning unit group comprises two of the wafer surface cleaning units, wherein the wafer surface cleaning unit is a common technology in the art, and the details are not repeated here.

In the present invention, the structures of the first process module and the second process module are the same, and the process flows of the first process module and the second process module are the same, and now only the process flow of the first process module is explained.

When the present invention works, with reference to FIG. 1, FIG. 2 and FIG. 7, the specific procedure is as follows:

The cassette group 112 is loaded with the wafers, and the cassette manipulator 111 grabs the wafers from the cassette group 112, and delivers the wafers to the first wafer transfer unit group 12112. Then the first inter-layer process manipulator 15 delivers the wafers to the sticking unit group 12115 to complete the sticking process. After the sticking process is completed, the first inter-layer process manipulator 15 delivers the wafers to the first wafer transfer high-precision cooling control unit group 12111;

The first intra-layer process manipulator 161 grabs the wafers from the first wafer transfer high-precision cooling control unit group 12111, and then delivers, in turn, the wafers to the coated anti-reflection bottom layer unit group, the high-temperature heat treatment unit group, the second high-precision cooling control unit group 12321, the coated photoresist unit group, the first heat treatment unit group and the first wafer transfer unit group 12112;

The first inter-layer process manipulator 15 grabs the wafers from the first wafer transfer unit group 12112, and then delivers the wafers to the second wafer transfer high-precision cooling control unit group 12114;

The second intra-layer process manipulator 162 grabs the wafers from the second wafer transfer high-precision cooling control unit group 12114, and then delivers, in turn, the wafers to the coated anti-reflection top layer unit group, the second heat treatment unit group, the first high-precision cooling control unit group 12121, the edge exposure unit group, the wafer back cleaning unit group, and the fourth wafer transfer unit group 12313;

The interface manipulator 141 grabs the wafers from the fourth wafer transfer unit group 12313, and then delivers the wafers to the lithography machine to complete the lithography process. After the lithography process is completed, the interface manipulator 141 grabs the wafers from the lithography machine, and then delivers the wafers to the fourth wafer transfer unit group 12313;

The second inter-layer process manipulator 17 grabs the wafers from the fourth wafer transfer unit group 12313, and then delivers, in turn, the wafers to the wafer surface cleaning unit group 12312, the fourth heat treatment unit group 12314 and the fourth wafer transfer high-precision cooling control unit group 12315;

The third intra-layer process manipulator 163 grabs the wafers from the fourth wafer transfer high-precision cooling control unit group 12315, and then delivers, in turn, the wafers to the second development unit group, the third heat treatment unit group, and the third wafer transfer high-precision cooling control unit group 12117;

The first inter-layer process manipulator 15 grabs the wafers from the third wafer transfer high-precision cooling control unit group 12117, and then delivers, in turn, the wafers to the wafer defect detection unit group 12116 and the second wafer transfer unit group 12113;

The cassette manipulator 111 grabs the wafers from the second wafer transfer unit group 12113, and then delivers the wafers to the cassette group 112 to complete a lithography process flow.

While the embodiments of the invention have been described in detail, it will be apparent to those skilled in the art that various modifications and changes can be made to the embodiments. However, it is to be understood that such modifications and variations are within the scope and spirit of the invention as described in the appended claims. Furthermore, the invention described herein is susceptible to other embodiments and may be embodied or carried out in various ways.

What is claimed is:

1. A coating and development equipment, comprising a cassette module, a first process module, a second process module, and an interface module, wherein one ends of the first process module and the second process module are connected to the cassette module, the other ends of the first process module and the second process module are connected to the interface module, a first inter-layer process manipulator, an intra-layer process manipulator group and a second inter-layer process manipulator are arranged between the first process module and the second process module, the intra-layer process manipulator group comprises, from bottom to top, a first intra-layer process manipulator, a second intra-layer process manipulator and a third intra-layer manipulator mounted on the same structure of the intra-layer process manipulator group, and the first inter-layer process manipulator, the second inter-layer process manipulator, and the first intra-layer process manipulator, the second intra-layer process manipulator, and the third intra-layer process manipulator each have two groups of end effectors facing oppositely, the number of each group of end effectors is m, and m is a natural number greater than or equal to 2.

2. The coating and development equipment according to claim 1, wherein the first intra-layer process manipulator comprises a first vertical sliding portion, a first horizontal sliding portion and a first effector base, the first vertical sliding portion is arranged on an upper side of the first horizontal sliding portion, the first vertical sliding portion is slidably connected with the first horizontal sliding portion, and the first effector base is arranged on one side of the first vertical sliding portion.

3. The coating and development equipment according to claim 2, wherein the first effector base comprises a connecting portion, a first execution portion and a second execution portion.

4. The coating and development equipment according to claim 3, wherein the connecting portion comprises a bearing portion and a vertical connecting portion, the vertical connecting portion is arranged on one side of the bearing portion, and the vertical connecting portion is slidably connected with the first vertical sliding portion.

5. The coating and development equipment according to claim 4, wherein an upper side of the bearing portion is provided with sliding rails of the execution portion, the sliding rails of the execution portion are perpendicular to the vertical connecting portion, and the first execution portion and the second execution portion are arranged on an upper side of the sliding rails of the execution portion, and the first execution portion and the second execution portion are both parallel to the vertical connecting portion, and the second execution portion is fixedly connected with the sliding rails of the execution portion, and a lower side of the first execution portion is provided with sliding blocks of the execution portion, and the sliding blocks of the execution portion are slidably connected with the sliding rails of the execution portion.

6. The coating and development equipment according to claim 5, wherein a first upper slideway and a first lower slideway are provided on one side of the first execution portion facing away from the second execution portion, and the first upper slideway is provided with a first upper bending plate, the first upper bending plate is slidably connected with the first upper slideway, the first lower slideway is provided with a first lower bending plate, the first lower bending plate is slidably connected with the first lower slideway, a first upper fixing plate is arranged on an upper side of the first upper bending plate and the first lower bending plate, and one side of the first upper fixing plate is provided with a first group of end effectors.

7. The coating and development equipment according to claim 5, wherein a second upper slideway and a second lower slideway are provided on one side of the second execution portion facing away from the first execution portion, and the second upper slideway is provided with a second upper bending plate, the second upper bending plate is slidably connected with the second upper slideway, the second lower slideway is provided with a second lower bending plate, the second lower bending plate is slidably connected with the second lower slideway, a second upper fixing plate is arranged on an upper side of the second upper bending plate and the second lower bending plate, and one side of the second upper fixing plate is provided with a second group of end effectors.

8. The coating and development equipment according to claim 5, wherein a first upper slideway and a first lower slideway are provided on one side of the first execution portion facing away from the second execution portion, and the first upper slideway is provided with a first upper bending plate, the first upper bending plate is slidably connected with the first upper slideway, the first lower slideway is provided with a first lower bending plate, the first lower bending plate is slidably connected with the first lower slideway, a first upper fixing plate is arranged on an upper side of the first upper bending plate and the first lower bending plate, and one side of the first upper fixing plate is provided with a first group of end effectors, a second upper slideway and a second lower slideway are provided on one side of the second execution portion facing away from the first execution portion, and the second upper slideway is provided with a second upper bending plate, the second upper bending plate is slidably connected with the second upper slideway, the second lower slideway is provided with a second lower bending plate, the second lower bending plate is slidably connected with the second lower slideway, a second upper fixing plate is arranged on the upper side of the second upper bending plate and the second lower bending plate, and one side of the second upper fixing plate is provided with a second group of end effectors, wherein the extension direction of the first group of end effectors is opposite to the extension direction of the second group of end effectors, and a first height difference exists between the first group of end effectors and the second group of end effectors.

9. The coating and development equipment according to claim 8, wherein a second height difference exists between the first process module and the second process module, and the first height difference is equal to the second height difference.

10. The coating and development equipment according to claim 8, wherein the first group of end effectors comprise a first end effector and a second end effector, and the second group of end effectors comprise a third end effector and a fourth end effector.

11. The coating and development equipment according to claim 2, wherein the first inter-layer process manipulator and the second inter-layer process manipulator each have the same structure, and the first inter-layer process manipulator comprises a second vertical sliding portion and a second effector base, and the second effector base and the first effector base have the same structure as each other.

12. The coating and development equipment according to claim 1, wherein the cassette module comprises a cassette manipulator and a cassette group, and the cassette manipulator is arranged between the cassette group and the first process module.

13. The coating and development equipment according to claim 12, wherein the cassette manipulator comprises n end effectors facing the same direction, and n is a natural number greater than or equal to 2.

14. The coating and development equipment according to claim 13, wherein the interface module has a built-in interface manipulator, and the interface manipulator and the cassette manipulator have the same structure as each other.

15. The coating and development equipment according to claim 1, wherein the first process module and the second process module each have the same structure, and the first process module comprises a first inter-layer process module, an intra-layer process module and a second inter-layer process module arranged in sequence.

16. The coating and development equipment according to claim 15, wherein the first inter-layer process module comprises a first inter-layer process unit and a first intra-layer transfer unit, and the first inter-layer process unit is located between the cassette module and the first intra-layer transfer unit.

17. The coating and development equipment according to claim 16, wherein the first inter-layer process unit comprises a first wafer transfer high-precision cooling control unit group, a first wafer transfer unit group, a second wafer transfer unit group, a second wafer transfer high-precision cooling control unit group, a sticking unit group, a wafer defect detection unit group, and a third wafer transfer high-precision cooling control unit group.

18. The coating and development equipment according to claim 17, wherein the first intra-layer transfer unit has a built-in first high-precision cooling control unit group, and the first high-precision cooling control unit group is connected with the sticking unit group.

19. The coating and development equipment according to claim 15, wherein the intra-layer process module comprises a first intra-layer process unit and a second intra-layer process unit, and the first intra-layer process unit is connected to the first inter-layer process module, and the second intra-layer process unit is connected to the second inter-layer process module.

20. The coating and development equipment according to claim 19, wherein the first intra-layer process unit comprises, from bottom to top, a first height intra-layer process unit, a second height intra-layer process unit and a third height intra-layer process unit.

21. The coating and development equipment according to claim 20, wherein the first height intra-layer process unit comprises, from bottom to top, a coated anti-reflection bottom layer unit group and a coated photoresist unit group, and the second height intra-layer process unit comprises, from bottom to top, a coated anti-reflection top layer unit group and a wafer backside cleaning unit group, the third height intra-layer process unit comprises a first development unit group.

22. The coating and development equipment according to claim 19, wherein the second intra-layer process unit comprises, from bottom to top, a fourth height intra-layer process unit, a fifth height intra-layer process unit and a sixth height intra-layer process unit.

23. The coating and development equipment according to claim 22, wherein the fourth height intra-layer process unit comprises, from bottom to top, a high-temperature heat treatment unit group and a first heat-treatment unit group, and the fifth height intra-layer process unit comprises, from bottom to top, a second heat treatment unit group and an edge exposure unit group, and the sixth height intra-layer process unit comprises, from bottom to top, a second development unit group and a third heat treatment unit group.

24. The coating and development equipment according to claim 15, wherein the second inter-layer process module comprises a second inter-layer process unit and a second intra-layer transfer unit, and the second inter-layer process unit is connected with the interface module, and the second intra-layer transfer unit is connected with the intra-layer process module.

25. The coating and development equipment according to claim 24, wherein the second inter-layer process unit comprises, from bottom to top, a third wafer transfer unit group, a wafer surface cleaning unit group, a fourth wafer transfer unit group, a fourth heat treatment unit group, and a fourth wafer transfer high-precision cooling control unit group.

26. The coating and development equipment according to claim 15, wherein the second inter-layer process module comprises a second inter-layer process unit and a second intra-layer transfer unit, the second inter-layer process unit is connected with the interface module, the second intra-layer transfer unit is connected with the intra-layer process module, the intra-layer process module comprises a first intra-layer process unit and a second intra-layer process unit, the first intra-layer process unit is connected to the first inter-layer process module, the second intra-layer process unit is connected to the second inter-layer process module, the first intra-layer process unit comprises, from bottom to top, a first height intra-layer process unit, a second height intra-layer process unit and a third height intra-layer process unit, the second intra-layer transfer unit comprises a second high-precision cooling control unit group, and the second high-precision cooling control unit group is connected with the high-temperature heat treatment unit group.

27. The coating and development equipment according to claim 19, wherein the first intra-layer process unit comprises, from bottom to top, a first height intra-layer process unit, a second height intra-layer process unit and a third height intra-layer process unit, the second intra-layer process unit comprises, from bottom to top, a fourth height intra-layer process unit, a fifth height intra-layer process unit and a sixth height intra-layer process unit, the first intra-layer process manipulator, the first height intra-layer process unit, and the fourth height intra-layer process unit are located in the same horizontal plane, the second intra-layer process manipulator, the second height intra-layer process unit and the fifth height intra-layer process unit are located in the same horizontal plane, and the third intra-layer process manipulator, the third height intra-layer process unit and the sixth height intra-layer process unit are located in the same horizontal plane.

* * * * *